United States Patent
Kikuchi (10) Patent No.: US 9,634,498 B2
(45) Date of Patent: Apr. 25, 2017

(54) ELECTRICAL STORAGE SYSTEM AND EQUALIZING METHOD

(71) Applicant: Takuro Kikuchi, Ichinomiya (JP)

(72) Inventor: Takuro Kikuchi, Ichinomiya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 139 days.

(21) Appl. No.: 14/403,736

(22) PCT Filed: Aug. 6, 2013

(86) PCT No.: PCT/IB2013/001732
§ 371 (c)(1),
(2) Date: Nov. 25, 2014

(87) PCT Pub. No.: WO2014/024030
PCT Pub. Date: Feb. 13, 2014

(65) Prior Publication Data
US 2015/0137763 A1 May 21, 2015

(30) Foreign Application Priority Data
Aug. 8, 2012 (JP) ................. 2012-176259

(51) Int. Cl.
*H02J 7/00* (2006.01)
*B60L 11/18* (2006.01)
*G01R 31/36* (2006.01)

(52) U.S. Cl.
CPC ......... *H02J 7/0014* (2013.01); *B60L 11/1861* (2013.01); *B60L 11/1866* (2013.01);
(Continued)

(58) Field of Classification Search
CPC .............................. H02J 7/0014; H02J 7/0016
(Continued)

(56) References Cited

U.S. PATENT DOCUMENTS

2006/0097698 A1 5/2006 Plett
2009/0102434 A1* 4/2009 Nakajima ............... H02J 7/345
320/166

(Continued)

FOREIGN PATENT DOCUMENTS

| JP | A-2001-218376 | 8/2001 |
| JP | A-2003-333762 | 11/2003 |
| JP | A-2008-520179 | 6/2008 |

*Primary Examiner* — Drew A Dunn
*Assistant Examiner* — Sailesh Thapa
(74) *Attorney, Agent, or Firm* — Oliff PLC (57) ABSTRACT

An electrical storage system includes electrical storage elements connected in series with each other and being charged or discharged; discharge circuits respectively connected in parallel with the electrical storage elements and discharging the corresponding electrical storage elements; and a controller controlling operations of the discharge circuits. The controller calculates a first SOC difference using a full charge capacity of each electrical storage element. The first SOC difference is a difference in SOC between the electrical storage elements and arises due to a difference in full charge capacity between the electrical storage elements. The controller calculates a second SOC difference that is a difference in SOC between the electrical storage elements at the moment the second SOC difference is calculated. When the second SOC difference is larger than the first SOC difference, the controller brings the second SOC difference close to the first SOC difference through a discharge with the discharge circuits.

6 Claims, 7 Drawing Sheets

(52) U.S. Cl.
CPC ..... *G01R 31/3606* (2013.01); *G01R 31/3648* (2013.01); *H02J 7/0016* (2013.01); *Y02T 10/7005* (2013.01); *Y02T 10/7044* (2013.01); *Y02T 10/7055* (2013.01); *Y02T 10/7061* (2013.01)

(58) Field of Classification Search
USPC ........ 320/116, 118, 132, 134, 122; 324/434, 324/425, 433, 426, 427, 432
See application file for complete search history.

(56) References Cited

U.S. PATENT DOCUMENTS

| | | | |
|---|---|---|---|
| 2011/0095765 A1* | 4/2011 | Tae | G01R 31/3658 324/434 |
| 2011/0234164 A1* | 9/2011 | Furukawa | H02J 7/0018 320/118 |
| 2012/0268070 A1* | 10/2012 | Park | H01M 10/441 320/126 |
| 2013/0013238 A1* | 1/2013 | Kawakita | H02J 7/044 702/63 |

* cited by examiner

ELECTRICAL STORAGE SYSTEM AND EQUALIZING METHOD

BACKGROUND OF THE INVENTION

1. Field of the Invention

The invention relates to a technique for equalizing state of charge variations among a plurality of electrical storage elements.

2. Description of Related Art

In Japanese Patent Application Publication No. 2001-218376 (JP 2001-218376 A), a voltage value of each of a plurality of single cells is detected and, when there are voltage value variations among the plurality of single cells, specified one or two or more of the single cells are discharged such that voltage value variations fall within an allowable range. Specifically, by discharging the single cells having a high voltage value, the voltage values of the plurality of single cells are caused to fall within the allowable range. Such a process is called equalizing process.

It is known that a full charge capacity of each single cell decreases with degradation of the single cell. When the full charge capacity has decreased, the state of charge (SOC) of the corresponding single cell also varies with a decrease in full charge capacity. The SOC is the percentage of a current amount of charge with respect to the full charge capacity. Therefore, when the full charge capacity varies, the SOC also varies.

In the technique described in JP 2001-218376 A, when there are SOC variations, specified one or two or more of the single cells are discharged such that the SOC in each of the plurality of single cells falls within the allowable range. In this case, even when the SOC varies due to full charge capacity variations, the equalizing process is carried out.

When the full charge capacity varies among the plurality of single cells, changes in SOC as a result of charging and discharging of each single cell differ depending on full charge capacity variations. In such a situation, when the equalizing process is carried out only on the condition that the SOC varies, electric energy stored in the single cells may be wastefully consumed.

SUMMARY OF THE INVENTION

A first aspect of the invention provides an electrical storage system. The electrical storage system includes: a plurality of electrical storage elements connected in series with each other and configured to be charged or discharged; discharge circuits respectively connected in parallel with the electrical storage elements and configured to discharge the corresponding electrical storage elements; and a controller configured to control operations of the discharge circuits. The controller is configured to calculate a first SOC difference using a full charge capacity of each electrical storage element. The first SOC difference is a difference in SOC between the plurality of electrical storage elements and arises due to a difference in full charge capacity between the plurality of electrical storage elements. The controller is configured to calculate a second SOC difference. The second SOC difference is a difference in SOC between the plurality of electrical storage elements at the moment the SOC difference is calculated. When the second SOC difference is larger than the first SOC difference, the controller is configured to bring the second SOC difference close to the first SOC difference by carrying out a discharge with the use of the discharge circuits.

When there is a full charge capacity variation between the plurality of electrical storage elements, the SOCs of the plurality of electrical storage elements may tend to vary due to the variation. That is, when the full charge capacities vary, the SOCs tend to vary each time the plurality of electrical storage elements are charged or discharged, so a discharging process using the discharge circuits may easily carried out.

Therefore, with the above configuration, an SOC variation, which arises due to a full charge capacity variation, is acquired in advance, and the discharging process using the discharge circuits is not carried out for such an SOC variation. Thus, it is possible to suppress a situation that the discharging process is frequently carried out on the basis of an SOC variation due to a full charge capacity variation and, as a result, electric energy stored in the electrical storage elements tends to be wastefully consumed through the discharging process.

An SOC variation not only includes an SOC variation due to a full charge capacity variation but also an SOC variation due to a self-discharge of the electrical storage elements, or the like. With the above configuration, the discharging process using the discharge circuits is carried out for an SOC variation due to a self-discharge of the electrical storage elements, or the like, so it is possible to suppress an SOC variation.

In the electrical storage system, the first SOC difference may be, for example, calculated using a mathematical expression (I)

$$\Delta SOC\_var\_fcc[0, k] = \frac{(FCC[k] - FCC[0]) \times (SOC\_base - SOC[0])}{FCC[k]} \quad (1)$$

where $\Delta SOC\_var\_fcc[0, k]$ is the first SOC difference, $FCC[0]$ is the full charge capacity of the electrical storage element that becomes a reference electrical storage element between the plurality of electrical storage elements, $FCC[k]$ is the full charge capacity of the electrical storage element other than the reference electrical storage element between the plurality of electrical storage elements, $SOC\_base$ is an SOC at the time when the SOCs of the plurality of electrical storage elements are equal to each other, and $SOC[0]$ is the SOC of the reference electrical storage element.

In the electrical storage system, the first SOC difference may be, for example, corrected using a mathematical expression (II)

$$\Delta SOC\_var\_alw[0,k] = \Delta SOC\_var\_fcc[0,k] \times (1+|SOC\_base-SOC[k]| \times K) \quad (II)$$

where $\Delta SOC\_var\_alw[0, k]$ is the corrected first SOC difference, $\Delta SOC\_var\_fcc[0, k]$ is the not-yet-corrected first SOC difference, $SOC\_base$ is an SOC at the time when the SOCs of the plurality of electrical storage elements are equal to each other, $SOC[k]$ is the SOC of the electrical storage element other than the reference electrical storage element, and K is a correction coefficient.

The plurality of electrical storage elements are connected in series with each other, so the same amount of electric energy is charged or discharged between the plurality of electrical storage elements. In the case where there is a full charge capacity variation between the plurality of electrical storage elements, when a charge or a discharge is carried out in a state where the SOCs of the plurality of electrical storage elements are equal to each other (SOC_base), the SOCs of the plurality of electrical storage elements may tend to vary. Therefore, according to the above mathematical expression (II), the first SOC difference is corrected in consideration of the difference between the SOC_base and the current SOC (SOC[k]) of each electrical storage element. This makes it easy to acquire an SOC variation between the plurality of electrical storage elements.

On the other hand, the first SOC difference may be calculated in consideration of a calculation error at the time of calculating the full charge capacity of each electrical storage element. When the full charge capacity of each electrical storage element is calculated, a current value of each electrical storage element is detected with the use of a current sensor and a voltage value of each electrical storage element is detected with the use of a voltage sensor. Therefore, when the full charge capacity of each electrical storage element is calculated, a detection error of the current sensor or a detection error of the voltage sensor may tend to be included. Therefore, by correcting the first SOC difference in consideration of such a detection error, it is possible to accurately acquire the first SOC difference.

In the electrical storage system, the SOC_base may be an SOC that each electrical storage element can take when the plurality of electrical storage elements are not connected to a load.

When the electrical storage elements are not connected to a load, it is possible to acquire an open circuit voltage (OCV) of each electrical storage element. Therefore, with the above configuration, it becomes easy to identify the SOC of each electrical storage element from the OCV of the electrical storage element. That is, it is possible to improve the accuracy of estimating the SOC. By setting the SOC, of which the estimating accuracy is ensured, as the SOC_base, it becomes easy to acquire a situation that the SOCs of the plurality of electrical storage elements are equal to each other. In addition, when the first SOC difference is calculated from the above mathematical expressions (I), (II), it is possible to exclude an SOC_base variation due to an estimating accuracy variation, so it is possible to accurately acquire the first SOC difference.

In the electrical storage system, the SOC_base may vary on the basis of a usage frequency of a charging function (hereinafter, referred to as timer charging function) for completing a charge of the plurality of electrical storage elements at predetermined time.

In the electrical storage system, the SOC_base may decrease as the usage frequency of the charging function increases, and the SOC_base may increase as the usage frequency of the charging function decreases.

With the timer charging function, a charge of the electrical storage elements is started at predetermined time. In other words, the electrical storage elements are not charged until the predetermined time. When the electrical storage elements are charged, the SOCs of the electrical storage elements are often low. Therefore, when the usage frequency of the timer charging function is high, each electrical storage element is often continuously kept in a low SOC state while the electrical storage elements are not connected to a load. Thus, when the usage frequency of the timer charging function is high, a low SOC value may be used as the SOC_base.

On the other hand, when the electrical storage elements are charged without using the timer charging function, a charge is immediately started without waiting until the predetermined time. Therefore, while the electrical storage elements are not connected to a load, each electrical storage element tends to be kept in a completely charged state, in other words, in a high SOC state. Thus, when the usage frequency of the timer charging function is low, a high SOC value may be used as the SOC_base.

In the electrical storage system, the controller may be configured to use a value, including a calculation error at the time of calculating the full charge capacity of each electrical storage element, as the first SOC difference.

In the electrical storage system, the controller may be configured to, when the plurality of electrical storage elements are not connected to a load, operate the discharge circuits.

When the plurality of electrical storage elements are not connected to a load, the electrical storage elements are not charged or discharged in response to operations of the load. Therefore, with the above configuration, it becomes easy to ensure a period of time for carrying out a discharge with the use of the discharge circuits.

A second aspect of the invention provides an equalizing method of equalizing a difference in SOC between a plurality of electrical storage elements, connected in series with each other, with the use of discharge circuits respectively connected in parallel with the electrical storage elements and configured to discharge the corresponding electrical storage elements. The equalizing method includes: calculating a first SOC difference using a full charge capacity of each electrical storage element, the first SOC difference being a difference in SOC between the plurality of electrical storage elements and arising due to a difference in full charge capacity between the plurality of electrical storage elements; calculating a second SOC difference, the second SOC difference being a difference in SOC between the plurality of electrical storage elements at the moment the SOC difference is calculated, and, when the second SOC difference is larger than the first SOC difference, bringing the second SOC difference close to the first SOC difference by carrying out a discharge with the use of the discharge circuits.

According to the second aspect as well, similar advantageous effects to those of the first aspect may be obtained.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, an embodiment of the invention will be described.

Figure 1:
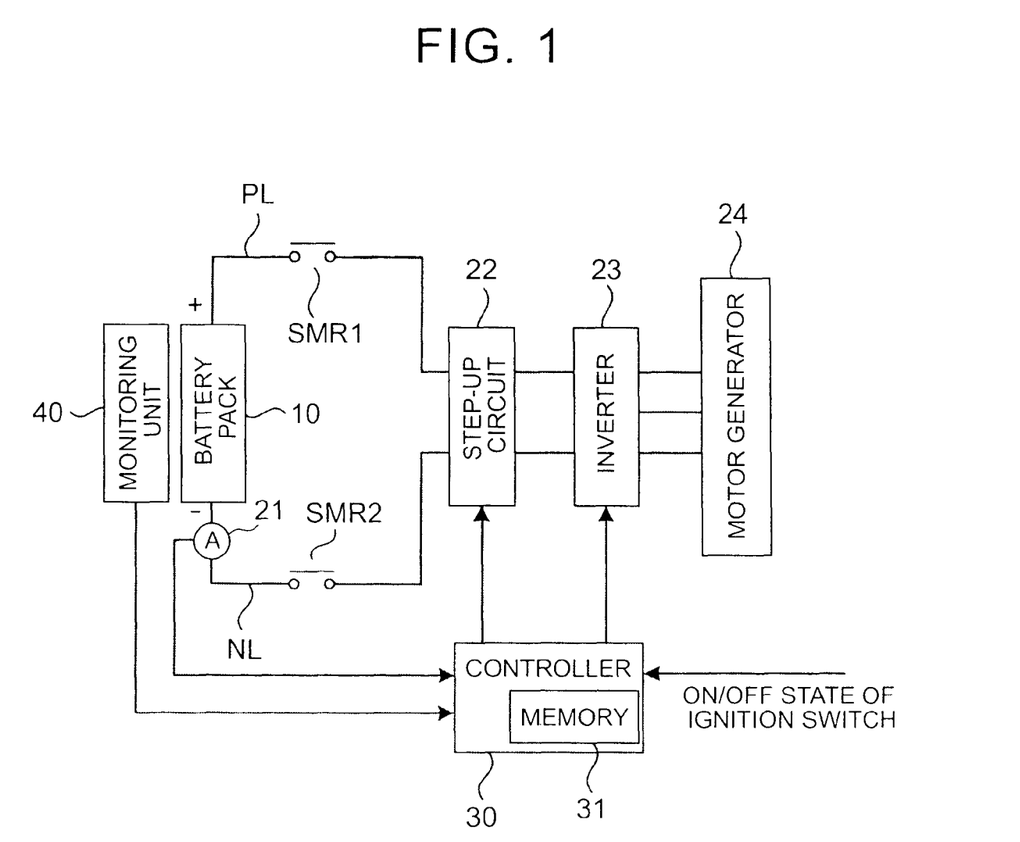
FIG. 1 is a schematic view that shows the configuration of a battery system according to an embodiment of the invention.

A battery system according to a first embodiment of the invention will be described with reference to FIG. 1. FIG. 1 is a schematic view that shows the configuration of the battery system according to the present embodiment.

The battery system shown in FIG. 1 is mounted on a vehicle. The vehicle may be a hybrid vehicle or an electric vehicle. The hybrid vehicle is a vehicle that includes a fuel cell, an engine, or the like, in addition to a battery pack (described later) as a power source for propelling the vehicle. The electric vehicle is a vehicle that includes only the battery pack as a power source of the vehicle.

A positive electrode line (high-voltage cable) PL is connected to a positive electrode terminal of the battery pack (or electrical storage device) 10, and a system main relay SMR1 is provided in the positive electrode line PL. A negative electrode line (high-voltage cable) NL is connected to a negative electrode terminal of the battery pack 10, and a system main relay SMR2 is provided in the negative electrode line NL.

Each of the system main relays SMR1, SMR2 switches between an on state and an off state upon reception of a control signal from a controller 30. The controller 30 is able to connect the battery pack 10 to a load (a step-up circuit 22 (described later)) by switching each of the system main relays SMR1, SMR2 from the off state to the on state.

A current sensor 21 detects a current value at the time when the battery pack 10 is charged or discharged, and outputs a detected result to the controller 30. A positive value may be used as a current value when the battery pack 10 is discharged, and a negative value may be used as a current value when the battery pack 10 is charged. In the present embodiment, the current sensor 21 is provided in the negative electrode line NL; however, the arrangement of the current sensor 21 is not limited to this configuration. The current sensor 21 just needs to detect a current value when the battery pack 10 is charged or discharged. Specifically, the current sensor 21 may be provided in at least one of the positive electrode line PL and the negative electrode line NL.

The battery pack 10 is connected to the step-up circuit 22 via the positive electrode line PL and the negative electrode line NL. The step-up circuit 22 steps up the output voltage of the battery pack 10, and outputs the stepped-up electric power to an inverter 23. The inverter 23 converts direct-current power, output from the step-up circuit 22, to alternating-current power, and outputs the alternating-current power to a motor generator 24. The motor generator 24 receives alternating-current power from the inverter 23, and generates kinetic energy for propelling the vehicle. By transmitting the kinetic energy generated by the motor generator 24 to wheels, it is possible to propel the vehicle.

When the vehicle is decelerated or the vehicle is stopped, the motor generator 24 converts kinetic energy that is generated during braking of the vehicle to electric energy (alternating-current power). The alternating-current power generated by the motor generator 24 is converted to direct-current power by the inverter 23. The step-up circuit 22 steps down the output voltage of the inverter 23, and then supplies the direct-current power to the battery pack 10. Thus, it is possible to store regenerated electric power in the battery pack 10.

The controller 30 includes a memory 31. The memory 31 stores information that is used when the controller 30 executes a specific process (particularly, a process described in the present embodiment). In the present embodiment, the memory 31 is incorporated in the controller 30; instead, the memory 31 may be provided outside of the controller 30.

Information about on/off states of an ignition switch of the vehicle is input to the controller 30. When the ignition switch is switched from the off state to the on state, the controller 30 connects the battery pack 10 to the step-up circuit 22 by switching each of the system main relays SMR1, SMR2 from the off state to the on state. Thus, the battery system shown in FIG. 1 enters an activated state (ready-on state).

On the other hand, when the ignition switch is switched from the on state to the off state, the controller 30 interrupts connection between the battery pack 10 and the step-up circuit 22 by switching each of the system main relays SMR1, SMR2 from the on state to the off state. Thus, the battery system shown in FIG. 1 enters a stopped state (ready-off state).

Figure 2:
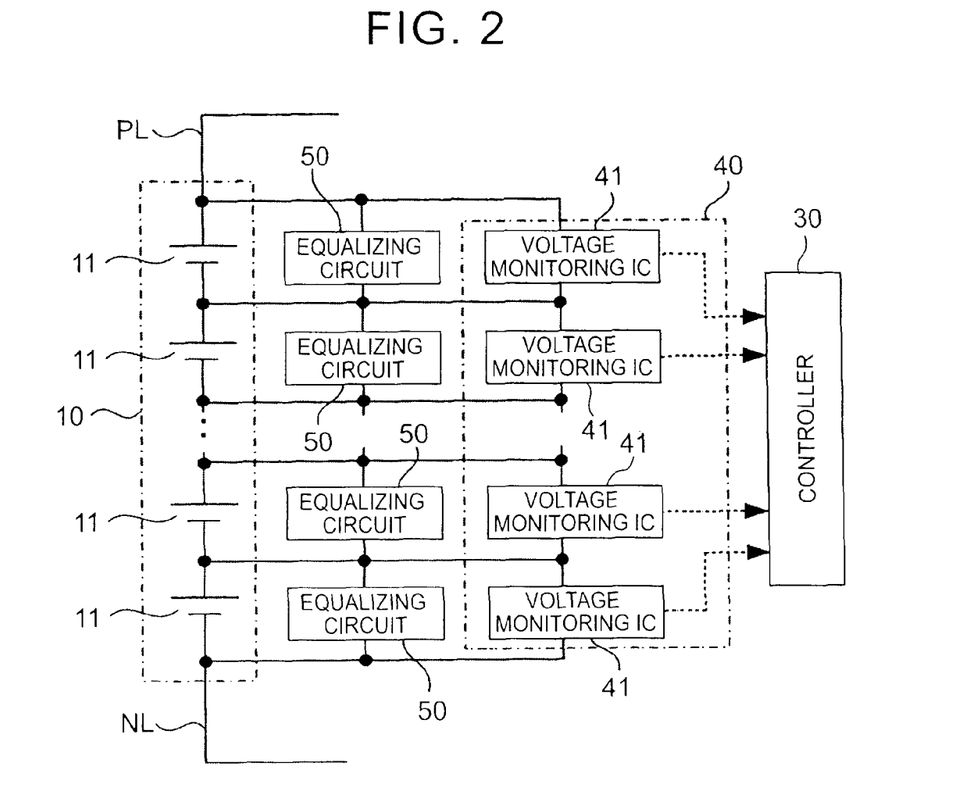
FIG. 2 is a view that shows the configuration of a battery pack and monitoring unit in the battery system according to the embodiment.

A monitoring unit 40 detects a voltage value of the battery pack 10 or detects a voltage value of each of single cells included in the battery pack 10, and then outputs a detected result to the controller 30. FIG. 2 shows the configuration of the battery pack 10 and monitoring unit 40.

As shown in FIG. 2, the battery pack 10 includes a plurality of single cells 11 (which correspond to electrical storage elements) connected in series with one another. The number of the single cells 11 that constitute the battery pack 10 may be set as needed on the basis of a required output, or the like, of the battery pack 10. The battery pack 10 may include a plurality of the single cells 11 connected in parallel with each other. Each single cell 11 may be a secondary battery, such as a nickel metal hydride battery and a lithium ion battery. Instead of the secondary battery, an electric double layer capacitor may be used.

The monitoring unit 40 includes a plurality of voltage monitoring integrated circuits (ICs) 41, and the number of the voltage monitoring ICs 41 is equal to the number of the single cells 11 that constitute the battery pack 10. Each voltage monitoring IC 41 is connected in parallel with a corresponding one of the single cells 11, detects a voltage value of a corresponding one of the single cells 11, and outputs a detected result to the controller 30.

Equalizing circuits 50 (which correspond to discharge circuits) are respectively connected to the single cells 11. Each of the equalizing circuit 50 is connected in parallel to the corresponding single cell 11. The equalizing circuits 50 are used to equalize the voltage values of the plurality of single cells 11 by discharging the corresponding single cells 11. For example, when the voltage value of a specified one of the single cells 11 is higher than the voltage values of the other single cells 11, the equalizing circuit 50 corresponding to the specified one of the single cells 11 discharges the specified one of the single cells 11.

Thus, it is possible to equalize the voltage value of the specified one of the single cells 11 to the voltage values of the other single cells 11 As a result, it is possible to suppress voltage value variations among the plurality of single cells 11. When the single cell 11 is discharged, electric energy stored in the single cell 11 is consumed.

Figure 3:
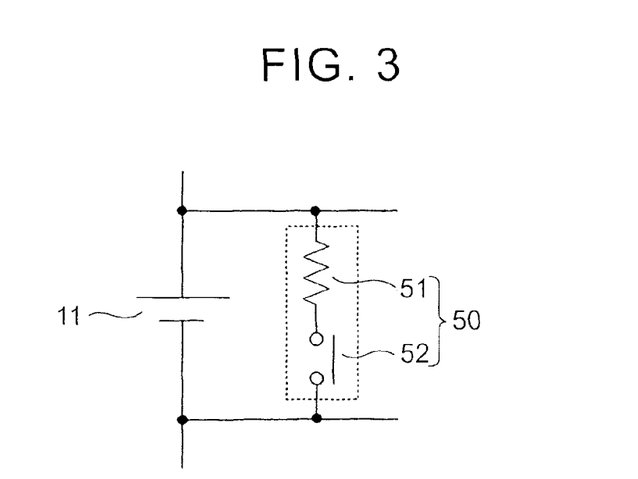
FIG. 3 is a view that shows the configuration of each equalizing circuit according to the embodiment.

FIG. 3 shows the configuration of each equalizing circuit 50. As shown in FIG. 3, each equalizing circuit 50 includes a resistor 51 and a switch 52. The resistor 51 and the switch 52 are connected in series with each other. The switch 52 switches between an on state and an off state upon reception of a control signal from the controller 30. When the switch 52 switches from the off state to the on state, current flows from the single cell 11 to the resistor 51, so it is possible to discharge the single cell 11. When the switch 52 switches from the on state to the off state, it is possible to stop a discharge of the single cell 11.

In the present embodiment, the voltage monitoring IC 41 and the equalizing circuit 50 are provided in correspondence with each single cell 11; however, the arrangement is not limited to this configuration. For example, when the plurality of single cells 11 that constitute the battery pack 10 are divided into a plurality of battery blocks (which correspond to electrical storage elements), the voltage monitoring IC 41 and the equalizing circuit 50 may be provided in correspondence with each battery block.

Each battery block is formed of a plurality of single cells 11 connected in series with one another. By connecting the plurality of battery blocks in series with one another, the battery pack 10 is formed. In this case, each voltage monitoring IC 41 detects a voltage value of a corresponding one of the battery blocks, and outputs a detected result to the controller 30. The equalizing circuits 50 are able to equalize the voltage values of the plurality of battery blocks by discharging the corresponding battery blocks. Equalizing the voltage values of the single cells 11 or the voltage values of the battery blocks is called equalizing process.

In the configuration including the plurality of single cells 11, if there are voltage value variations among the plurality of single cells 11, the voltage value of a specified one of the single cells 11 may not reach an upper limit voltage when the plurality of single cells 11 are charged. In this case, although the voltage value of the specified one of the single cells 11 has not reached the upper limit voltage, the voltage values of the other single cells 11 may reach the upper limit voltage. The upper limit voltage is a voltage value set in order to suppress overcharging in controlling a charge of each single cell 11, so the other single cells 11 may become an overcharged state.

In addition, if there are voltage value variations among the plurality of single cells 11, the voltage value of the specified one of the single cells 11 may not reach a lower limit voltage when the plurality of single cells 11 are discharged. In this case, although the voltage value of the specified one of the single cells 11 has not reached the lower limit voltage, the voltage values of the other single cells 11 may reach the lower limit voltage. The lower limit voltage is a voltage value set in order to suppress overdischarging in controlling a discharge of each single cell 11, so the other single cells 11 may become an overdischarged state.

By carrying out the equalizing process, it is possible to equalize the voltage values of the plurality of single cells 11, so it is possible to prevent an overcharged state or overdischarged state of each of the single cells 11.

When the equalizing process is carried out, it is determined whether there are voltage value variations by monitoring the voltage value of each single cell 11 as described in JP 2001-218376 A. When there are voltage value variations among the plurality of single cells 11, the equalizing process is carried out. When the above equalizing process is carried out, the number of times the equalizing process is carried out may increase, and electric energy stored in the single cells 11 may tend to be wastefully consumed as will be described below.

Figure 4:
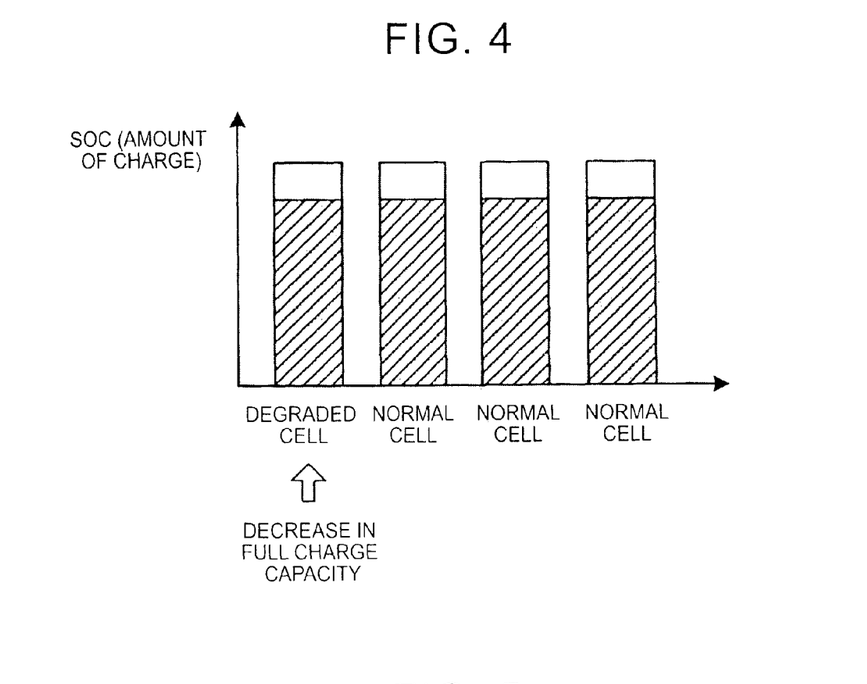
FIG. 4 is a view that shows a relationship in SOC among a plurality of single cells including a degraded single cell.

FIG. 4 shows four single cells 11, and the four single cells 11 are connected in series with one another. The ordinate axis shown in FIG. 4 represents the state of charge (SOC) of each single cell 11, in other words, the amount of charge of each single cell 11. The SOC is the percentage of a current amount of charge with respect to a full charge capacity.

In the example shown in FIG. 4, among the four single cells 11, the three single cells 11 are in a normal state, and the remaining one single cell 11 is in a degraded state. The degraded state is a state where the full charge capacity of the single cell 11 is decreased with respect to a full charge capacity in an initial state. The normal state is a state where the full charge capacity of the single cell 11 is kept at the full charge capacity in an initial state.

The initial state is a state where the single cell 11 is not degraded, and the initial state is, for example, a state immediately after the single cell 11 is manufactured. When a lithium ion secondary battery is used as the single cell 11, the full charge capacity of the single cell 11 decreases due to precipitation of lithium, or the like. In such a case, the single cell 11 becomes the degraded state.

In the state shown in FIG. 4, the SOCs of the four single cells 11 are equal to one another. The full charge capacity of the degraded single cell 11 is smaller than the full charge capacity of each normal single cell 11, so a current amount of charge (Ah) in the degraded single cell 11 and a current amount of charge (Ah) in each normal single cell 11 are different from each other.

Figure 5:
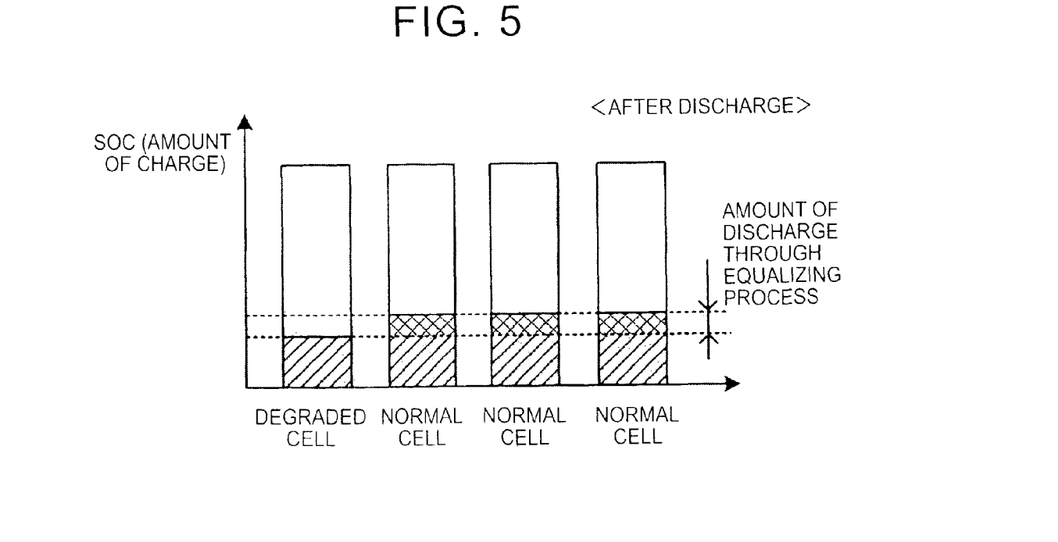
FIG. 5 is a view that shows SOC variations after the plurality of single cells in FIG. 4 have been discharged.

When the four single cells 11 are discharged in the state shown in FIG. 4, the four single cells 11 may become a state shown in FIG. 5. The full charge capacity of the degraded single cell 11 is lower than that of each normal single cell 11. Therefore, when the four single cells 11 are discharged by a predetermined amount of charge, the SOC of the degraded single cell 11 is lower than the SOC of each normal single cell 11. Thus, there arises an SOC variation between the degraded single cell 11 and each normal single cell 11.

When there are SOC variations, the equalizing process may be carried out on the basis of the voltage values of the four single cells 11. Therefore, in the state shown in FIG. 5, the normal single cells 11 are discharged by the amount of discharge shown in FIG. 5. Thus, the SOC of each normal single cell 11 is equalized to the SOC of the degraded single cell 11.

Figure 6:
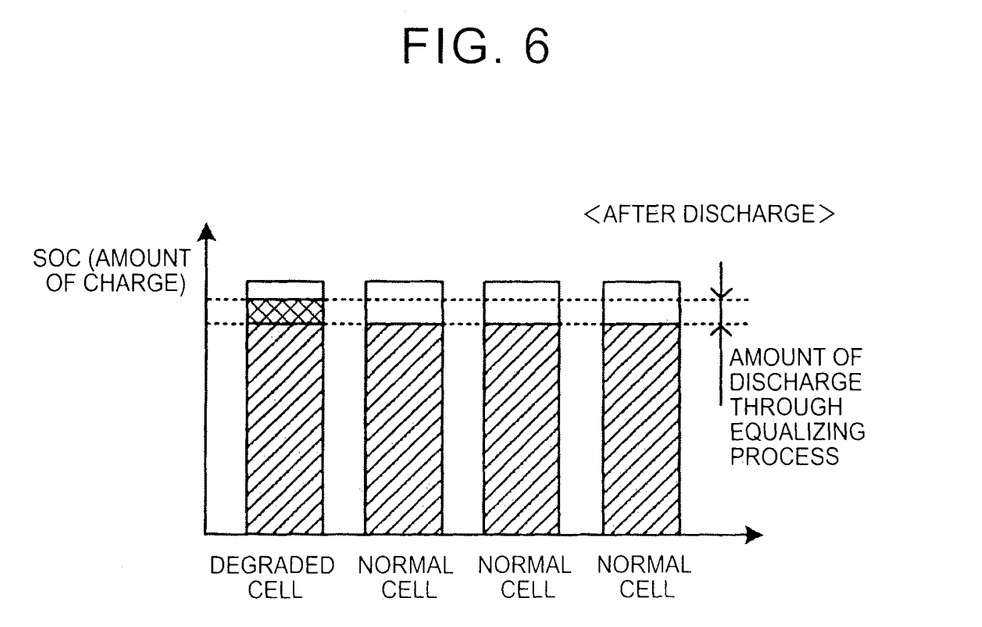
FIG. 6 is a view that shows SOC variations after the plurality of single cells have been charged.

After the equalizing process has been carried out in the state shown in FIG. 5, when the four single cells 11 are charged, the four single cells 11 may become a state shown in FIG. 6. The full charge capacity of the degraded single cell 11 is lower than that of each normal single cell 11. Therefore, when the four single cells 11 are charged by a predetermined amount of charge, the SOC of the degraded single cell 11 is higher than the SOC of each normal single cell 11. Thus, there arises an SOC variation between the degraded single cell 11 and each normal single cell 11.

When there are SOC variations, the equalizing process may be carried out on the basis of the voltage values of the four single cells 11. Therefore, in the state shown in FIG. 6, the degraded single cell 11 is discharged by the amount of discharge shown in FIG. 6. Thus, the SOC of the degraded single cell 11 is equalized to the SOC of each normal single cell 11.

As described above, when the full charge capacity of the single cell 11 is decreased due to degradation of the single cell 11, there arise SOC variations and the equalizing process is carried out each time a discharge or a charge is carried out. In the equalizing process, the single cells 11 are merely discharged. Therefore, if the equalizing process is carried out each time a discharge or a charge is carried out, electric energy stored in the single cells 11 may tend to be wastefully consumed.

In the present embodiment, in order to suppress wasteful consumption of electric energy as a result of the equalizing process, the equalizing process is carried out in consideration of the full charge capacity of each single cell 11. That is, in the present embodiment, as will be described later, SOC variations due to full charge capacity variations are not subjected to the equalizing process, and SOC variations due to a factor other than full charge capacity variations are subjected to equalizing process.

The factor other than full charge capacity variations is, for example, a self-discharge of the single cell 11. When each of the plurality of voltage monitoring ICs 41 is operating on the electric power of a corresponding one of the single cells 11, the SOC may vary among the plurality of single cells 11 due to consumed electric power variations among the voltage monitoring ICs 41.

The equalizing process according to the present embodiment will be described with reference to the flowchart shown in FIG. 7. The flowchart shown in FIG. 7 is executed by the controller 30.

Figure 7:
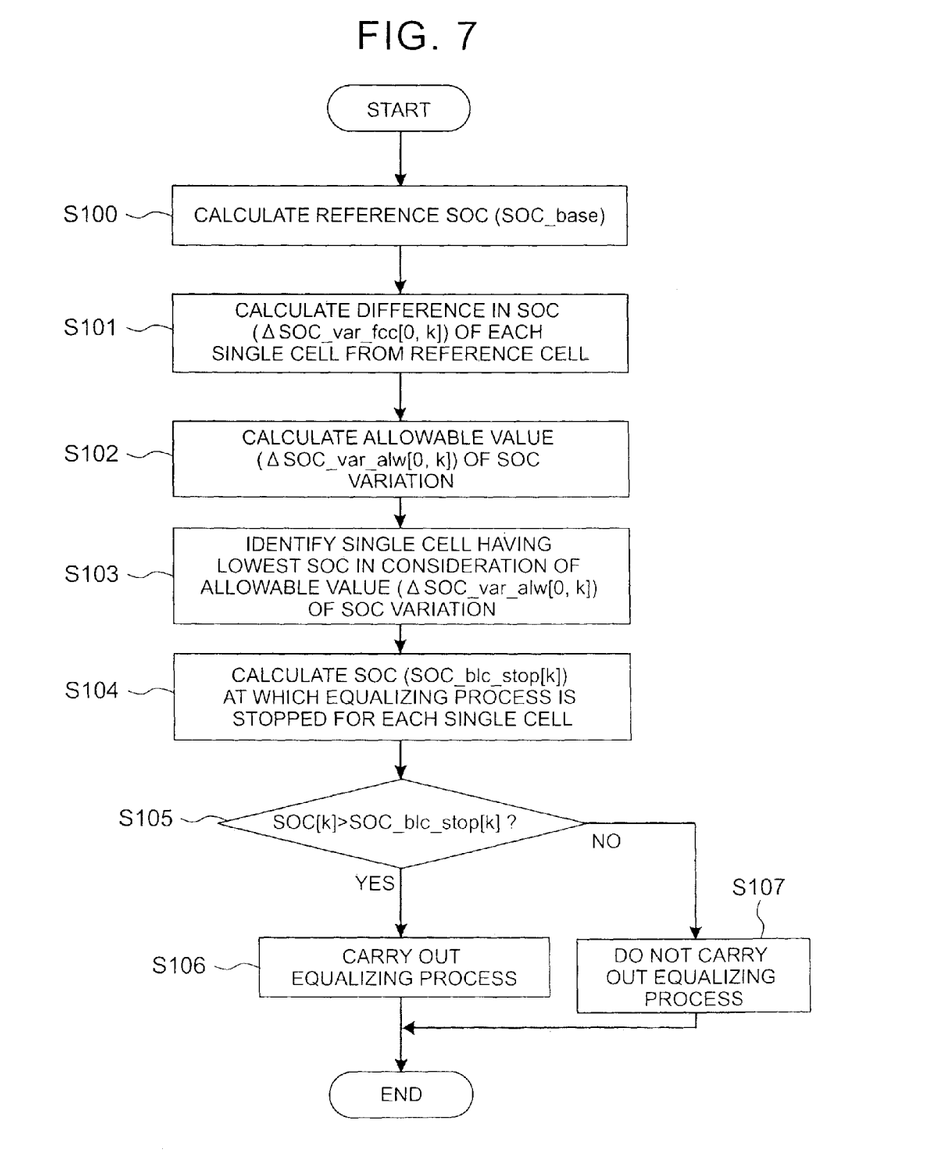
FIG. 7 is a flowchart that illustrates an equalizing process according to the embodiment.

The equalizing process shown in FIG. 7 is carried out when the ignition switch is in the off state, that is, the battery system shown in FIG. 1 is in the stopped state. When the ignition switch is in the off state, the battery pack 10 is not connected to the load and the battery pack 10 is not charged or discharged. Therefore, it is easy to ensure a period of time for carrying out the equalizing process.

In step S100, the controller 30 calculates a reference SOC (SOC_base). The reference SOC (SOC_base) is an SOC that is a reference at the time when SOC variations among the plurality of single cells 11 due to full charge capacity variations among the plurality of single cells 11 are equalized. Specifically, among the plurality of single cells 11 having full charge capacity variations, the SOC at the time when the SOCs are equalized (state shown in FIG. 4) is the reference SOC (SOC_base). When the reference SOC (SOC_base) has been calculated, the controller 30 stores information about the reference SOC (SOC_base) in the memory 31.

The equalizing process is carried out when the ignition switch is in the off state, so the reference SOC (SOC_base) is desirably an SOC that the single cell 11 can take when the ignition switch is in the off state. By setting the reference SOC (SOC_base) in this way, the SOC of each single cell 11 at the time when the equalizing process is carried out coincides with the reference SOC (SOC_base) or is close to the reference SOC (SOC_base).

Hereinafter, an example of calculating the reference SOC (SOC_base) will be described.

For example, while the ignition switch is in the off state, the SOC of each single cell 11, having a high occurrence frequency, may be set as the reference SOC (SOC_base).

In this case, initially, the SOC of each single cell 11 is calculated each time the ignition switch becomes the off state. When the ignition switch is in the off state, it is possible to acquire the open circuit voltage (OCV) of each single cell 11, so it is possible to estimate the SOC of each single cell 11 from the OCV of each single cell 11. The OCV and the SOC have a correspondence relationship, so, when the correspondence relationship is obtained in advance, it is possible to identify (estimate) the SOC from the OCV.

Subsequently, the occurrence frequency is measured for each value of the SOC. Specifically, the SOC of each single cell 11 at the time when the ignition switch is in the off state is estimated, and a counter corresponding to the value of the estimated SOC is incremented. The counter is provided for each value of the SOC, and a value of the counter indicates an occurrence frequency at each value of the SOC. Thus, it is possible to acquire a distribution that shows the occurrence frequency of the SOC at the time when the ignition switch is in the off state. The distribution that shows the occurrence frequency of the SOC may be, for example, expressed using a coordinate system in which the abscissa axis represents a value of the SOC and the ordinate axis represents an occurrence frequency.

When the distribution that shows the occurrence frequency of the SOC is acquired, it is possible to calculate an average value or identify a mode value on the basis of the frequency distribution. Such an average value or a mode value may be used as the reference SOC (SOC_base).

In the above description, the occurrence frequency of the SOC is measured only while the ignition switch is in the off state; however, the measurement timing is not limited to this configuration. That is, irrespective of whether the ignition switch is in the on state or in the off state, the occurrence frequency of the SOC may be measured over the entire period of time. In this case as well, it is possible to calculate an average value or identify a mode value on the basis of a distribution that shows the occurrence frequency of the SOC. Then, the average value or the mode value may be used as the reference SOC (SOC_base).

On the other hand, some of systems that are able to charge the battery pack 10 using electric power from an external power supply have the function of completing a charge of the battery pack 10 at predetermined time. The external power supply is a power supply installed outside of the battery system shown in FIG. 1, and the external power supply may be, for example, a commercial power supply. The function of completing a charge of the battery pack 10 at predetermined time is called timer charging.

Depending on the usage frequency of timer charging, when the ignition switch is in the off state, the SOC that each single cell 11 can take may vary. For example, as the frequency of timer charging increases, the SOC that each single cell 11 can take while the ignition switch is in the off state tends to become a lower value. In other words, while the ignition switch is in the off state, the occurrence frequency of a low SOC tends to be higher than the occurrence frequency of a high SOC.

In timer charging, a charge is started at predetermined time, so each single cell 11 is left in a state where the single cell 11 is not charged until the predetermined time. A charge of the battery pack 10 with the use of the external power supply tends to be carried out when the SOC of each single cell 11 is low, so the SOC of each single cell 11 that is left standing, in other words, the SOC of each single cell 11 while the ignition switch is in the off state, tends to become a lower value.

Therefore, while the ignition switch is in the off state, the occurrence frequency at the time when each single cell 11 is left standing without being charged tends to be higher than the occurrence frequency at the time when each single cell 11 is being charged. That is, while the ignition switch is in the off state, the SOC that each single cell 11 can take tends to become a lower value.

On the other hand, as the frequency of timer charging decreases, the SOC that each single cell 11 can take tends to become a higher value while the ignition switch is in the off state. In the case where no timer charging is carried out, when the external power supply and the battery pack 10 are connected to each other, the electric power of the external power supply is supplied to the battery pack 10, and a charge of the battery pack 10 is started. When the SOC of the battery pack 10 (single cells 11) has increased to a predetermined SOC, a charge of the battery pack 10 is completed.

During a period from completion of a charge of the battery pack 10 to a start of travel of the vehicle, each single cell 11 is left in a charged state. Therefore, while the ignition switch is in the off state, the occurrence frequency at the time when each single cell 11 is being charged tends to be higher than the occurrence frequency at the time when each single cell 11 is left standing without being charged. Thus, as the usage frequency of timer charging decreases, the SOC that each single cell 11 can take while the ignition switch is in the off state tends to become a higher value.

As described above, in consideration of the usage frequency of timer charging, it is possible to calculate the reference SOC (SOC_base). Specifically, when a relationship between the usage frequency of timer charging and an SOC (which corresponds to the reference SOC) that each single cell 11 can take while the ignition switch is in the off state is obtained in advance, it is possible to identify the reference SOC by measuring the usage frequency of timer charging. The usage frequency may be, for example, the number of times timer charging is carried out within a predetermined period.

Referring back to the flowchart of FIG. 7, in step S101, the controller 30 calculates a difference $\Delta SOC\_var\_fcc[0, k]$ between the SOC of the one reference single cell 11 (hereinafter, referred to as reference cell 11) and the SOC of one of the plurality of other single cells 11 (hereinafter, referred to as comparative cell 11). The difference $\Delta SOC\_var\_fcc[0, k]$ is a difference in SOC between the reference cell 11 and the comparative cell 11, which arises due to a difference in full charge capacity between the reference cell 11 and the comparative cell 11. The difference $\Delta SOC\_var\_fcc[0, k]$ corresponds to a first SOC difference or a not-yet-corrected first SOC difference according to the invention.

There are a plurality of the comparative cells 11, it is possible to acquire SOC variations among the plurality of single cells 11 by calculating the difference $\Delta SOC\_var\_fcc[0, k]$. In order to acquire SOC variations among the plurality of single cells 11, it is required to identify the reference single cell 11. In the present embodiment, the reference cell 11 is set. The reference cell 11 may be set in advance, and information about the reference cell 11 may be stored in the memory 31.

The controller 30 calculates the difference $\Delta SOC\_var\_fcc[0, k]$ on the basis of the following mathematical expression (1).

$$\Delta SOC\_var\_fcc[0, k] = \frac{(FCC[k] - FCC[0]) \times (SOC\_base - SOC[0])}{FCC[k]} \quad (1)$$

In the above mathematical expression (1), [0] denotes the reference cell 11, and [k] denotes the comparative cell 11. The number of the comparative cells 11 is a number (N−1) obtained by subtracting the number (1) of the reference cells 11 from the total number (N) of the single cells 11 that constitute the battery pack 10, and k is any value between "1" and "N−1".

FCC[0] denotes a current full charge capacity of the reference cell 11, and FCC[k] is a current full charge capacity of each comparative cell 11. SOC_base denotes the reference SOC calculated in the process of step S100, and SOC[0] denotes a current SOC of the reference cell 11. As is apparent from the above mathematical expression (1), when SOC[0] is equal to SOC_base, the difference $\Delta SOC\_var\_fcc[0, k]$ is 0. That is, the SOC[0] of the reference cell 11 and the SOC[k] of each of the comparative cells 11 are equal to SOC_base.

As shown in the above mathematical expression (1), it is possible to calculate the difference $\Delta SOC\_var\_fcc[0, k]$ on the basis of a relationship between full charge capacities FCC[k] and FCC[0], and on the basis of a relationship between the reference SOC (SOC_base) and SOC[0].

It is possible to calculate the full charge capacity FCC[0] of the reference cell 11 on the basis of a current value and a voltage value at the time when the reference cell 11 has been charged or discharged. For example, initially, when the reference cell 11 is charged or discharged, the SOC of the reference cell 11 is calculated at two mutually different timings. It is possible to calculate the SOC of the reference cell 11 from a current value and a voltage value at the time when the reference cell 11 has been charged or discharged.

The SOC and the OCV have a correspondence relationship, so, when the OCV is calculated, it is possible to identify the SOC. In addition, it is possible to calculate the OCV from a closed circuit voltage (CCV) and the internal resistance of the single cell 11. When each single cell 11 is not connected to the load, it is possible to acquire the OCV of the single cell 11. It is possible to calculate the internal resistance of each single cell 11 from the current value and voltage value of the single cell 11.

SOCs calculated at two mutually different timings are referred to as SOC_t1 and SOC_t2. On the other hand, an accumulated current value $\Sigma I$ is calculated by accumulating a current value flowing during a period from when the SOC of the reference cell 11 varies from SOC_t1 to SOC_t2. If it is possible to calculate SOC_t1, SOC_t2 and the accumulated current value $\Sigma I$, it is possible to calculate the full charge capacity FCC[0] of the reference cell 11 using the following mathematical expression (2).

$$FCC[0] = \frac{\Sigma I}{SOC\_t1 - SOC\_t2} \quad (2)$$

It is possible to calculate the full charge capacity FCC[k] of each comparative cell 11 on the basis of a current value and a voltage value at the time when the comparative cell 11 has been charged or discharged. Specifically, it is possible to calculate the full charge capacity FCC[k] of each comparative cell 11 by a method similar to the method of calculating the full charge capacity FCC[0] of the reference cell 11.

The above mathematical expression (1) may be derived from the following mathematical expressions (3), (4). As shown in the following mathematical expression (3), the difference $\Delta SOC\_var\_fcc[0, k]$ corresponds to the difference between the SOC[0] of the reference cell 11 and the SOC[k] of each comparative cell 11. The SOC[0] becomes a value obtained by dividing a current amount of charge Ah_chg by the full charge capacity FCC[0]. The SOC[k] becomes a value obtained by dividing the current amount of charge Ah_chg by the full charge capacity FCC[k]. The reference cell 11 and the comparative cells 11 are connected in series with each other, and the amount of charge Ah_chg in the reference cell 11 is equal to the amount of charge Ah_chg in each comparative cell 11.

On the other hand, the amount of charge Ah_chg is expressed by the following mathematical expression (4). The amount of charge Ah_chg may be defined as an accumulated current value during a period in which the SOC of the reference cell 11 varies from SOC_base to SOC[0], and it is possible to calculate the amount of charge Ah_chg by the following mathematical expression (4). By substituting the following mathematical expression (4) into the following mathematical expression (3), it is possible to derive the above mathematical expression (1).

$$\Delta SOC\_var\_fcc[0, k] = SOC[0] - SOC[k] = \frac{Ah\_chg}{FCC[0]} - \frac{Ah\_chg}{FCC[k]} \quad (3)$$

$$Ah\_chg = (SOC\_base - SOC[0]) \times FCC[0] \quad (4)$$

Figure 8:
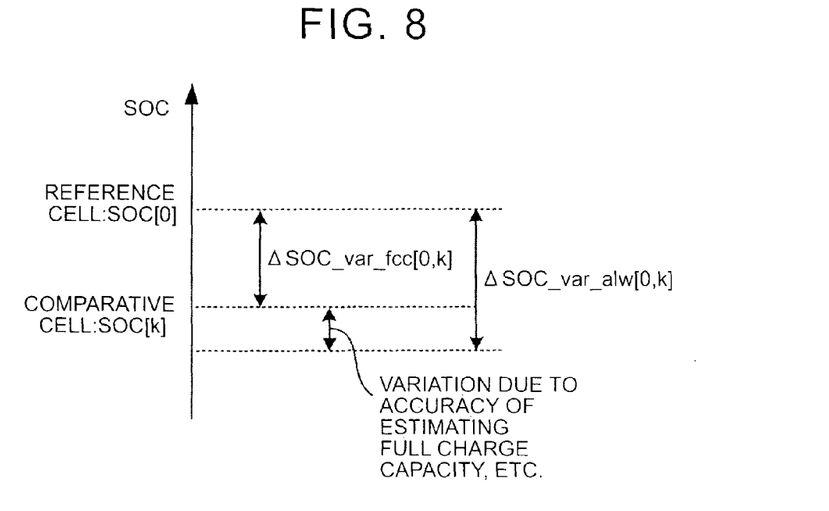
FIG. 8 is a view that illustrates an SOC variation between a reference cell and each comparative cell.

When the SOC[k] of the comparative cell 11 is lower than the SOC[0] of the reference cell 11, the difference $\Delta SOC\_var\_fcc[0, k]$ has a relationship shown in FIG. 8.

Referring back to the flowchart of FIG. 7, in step S102, the controller 30 calculates a value (allowable value) $\Delta SOC\_var\_alw[0, k]$ for allowing an SOC variation between the reference cell 11 and each comparative cell 11. The allowable value $\Delta SOC\_var\_alw[0, k]$ corresponds to the corrected first SOC difference according to the invention. A difference (theoretical value) in SOC between the reference cell 11 and each comparative cell 11 becomes the difference $\Delta SOC\_var\_fcc[0, k]$ calculated in the process of step S101. The allowable value $\Delta SOC\_var\_alw[0, k]$ is calculated using the difference $\Delta SOC\_var\_fcc[0, k]$ as a reference.

In consideration of the accuracy of estimating the full charge capacity of the reference cell 11 or the full charge capacity of each comparative cell 11, it is required to set an allowable amount of SOC variations on the basis of the estimating accuracy.

It is possible to calculate the full charge capacity FCC[0] of the reference cell 11 and the full charge capacity FCC[k] of the comparative cell 11 from a current value and a voltage value in the reference cell 11 and a current value and a voltage value in each comparative cell 11 as described above. However, the current value may contain a detection error of the current sensor 21, and the voltage value contains a detection error of the monitoring unit 40. In this case, as the current value continues to be accumulated, the detection error is also accumulated. Thus, the accuracy of estimating the full charge capacities FCC[0], FCC[k] may decrease.

When there is a full charge capacity variation between the reference cell 11 and each comparative cell 11, as the SOC[k] of each comparative cell 11 becomes apart from the reference SOC (SOC_base), an SOC variation tends to arise. In the process of step S102, the allowable value $\Delta SOC\_var\_alw[0, k]$ is calculated.

In the present embodiment, the allowable value $\Delta SOC\_var\_alw[0, k]$ is calculated in consideration of the accuracy of estimating the full charge capacities FCC[0], FCC[k] and the difference between the current SOC of each single cell 11 and the SOC_base. Specifically, the controller 30 is able to calculate the allowable value $\Delta SOC\_var\_alw[0, k]$ on the basis of the following mathematical expression (5).

$$\Delta SOC\_var\_alw[0,k] = \Delta SOC\_var\_fcc[0,k] \times (1+|SOC\_base-SOC[k]| \times K) \quad (5)$$

K shown in the above mathematical expression (5) denotes a correction coefficient (constant). The correction coefficient K may be, for example, set in advance in consideration of the accuracy of estimating the full charge capacities FCC[0], FCC[k]. Information about the correction coefficient K may be stored in the memory 31. As described above, as the SOC[k] becomes apart from the SOC_base, the SOC[k] tends to vary with a full charge capacity variation. Thus, in the above mathematical expression (5), the allowable value $\Delta SOC\_var\_alw[0, k]$ is calculated in consideration of the difference between the SOC_base and each SOC[k].

According to the above mathematical expression (5), as the difference between the SOC_base and each SOC[k] increases, the allowable value $\Delta SOC\_var\_alw[0, k]$ tends to increase. On the other hand, when the SOC[k] is equal to the SOC_base, the allowable value $\Delta SOC\_var\_alw[0, k]$ is equal to the difference $\Delta SOC\_var\_fcc[0, k]$.

In the present embodiment, the allowable value $\Delta SOC\_var\_alw[0, k]$ is calculated on the basis of the above mathematical expression (5); however, a method of calculating the allowable value $\Delta SOC\_var\_alw[0, k]$ is not limited to this configuration. The allowable value $\Delta SOC\_var\_alw[0, k]$ just needs to be a value obtained by adding an allowable amount based on, for example, the accuracy of estimating the full charge capacities to the difference $\Delta SOC\_var\_fcc[0, k]$ that is a reference. For example, as the accuracy of estimating the full charge capacities increases, the allowable amount may be reduced; whereas, as the accuracy of estimating the full charge capacities decreases, the allowable amount may be increased.

In addition, as described above, an SOC variation tends to arise as the SOC[k] becomes apart from the reference SOC (SOC_base), so it is possible to set the allowable amount on the basis of the difference between the reference SOC (SOC_base) and the current SOC[k] of each comparative cell 11. For example, when a relationship between the allowable amount and the difference between the SOC_base and each SOC[k] is obtained in advance, it is possible to identify the allowable amount on the basis of the difference between the SOC_base and each SOC[k].

When the SOC[k] of the comparative cell 11 is lower than the SOC[0] of the reference cell 11, the allowable value $\Delta SOC\_var\_alw[0, k]$ has a relationship shown in FIG. 8. The difference between the allowable value $\Delta SOC\_var\_alw[0, k]$ and the difference $\Delta SOC\_var\_fcc[0, k]$ contains a variation due to the accuracy of estimating the full charge capacities and a variation due to the fact that the SOC[k] becomes apart from the SOC_base.

Referring back to FIG. 7, in step S103, the controller 30 identifies the comparative cell 11 having the lowest SOC in consideration of the allowable value $\Delta SOC\_var\_alw[0, k]$ calculated in the process of step S102. Specifically, the controller 30 identifies the comparative cell 11 having the largest allowable value $\Delta SOC\_var\_alw[0, k]$ among the plurality of comparative cells 11. In the comparative cell 11 in which the SOC[k] is lower than the SOC[0] and the allowable value $\Delta SOC\_var\_alw[0, k]$ is the largest, the SOC[k] is apart from the reference SOC (SOC_base) the most. Thus, in the above comparative cell 11, the SOC is the lowest.

Subsequently, in step S104, the controller 30 calculates an SOC (SOC_blc_stop[k]), at which the equalizing process is stopped, for each comparative cell 11. The SOC_blc_stop[k] is a reference with reference to which it is determined whether the equalizing process is carried out in each comparative cell 11. Specifically, the controller 30 calculates the SOC_blc_stop[k] on the basis of the following mathematical expression (6).

$$SOC\_blc\_stop[k] = SOC[\min] + \Delta SOC\_var\_alw[0, \min] - \Delta SOC\_var\_alw[0,k] \quad (6)$$

In the above mathematical expression (6), SOC[min] is the SOC[k] of the comparative cell 11 identified in the process of step S103. $\Delta SOC\_var\_alw[0, \min]$ is the allowable value $\Delta SOC\_var\_alw[0, k]$ in the comparative cell 11 identified in the process of step S103.

Figure 9:
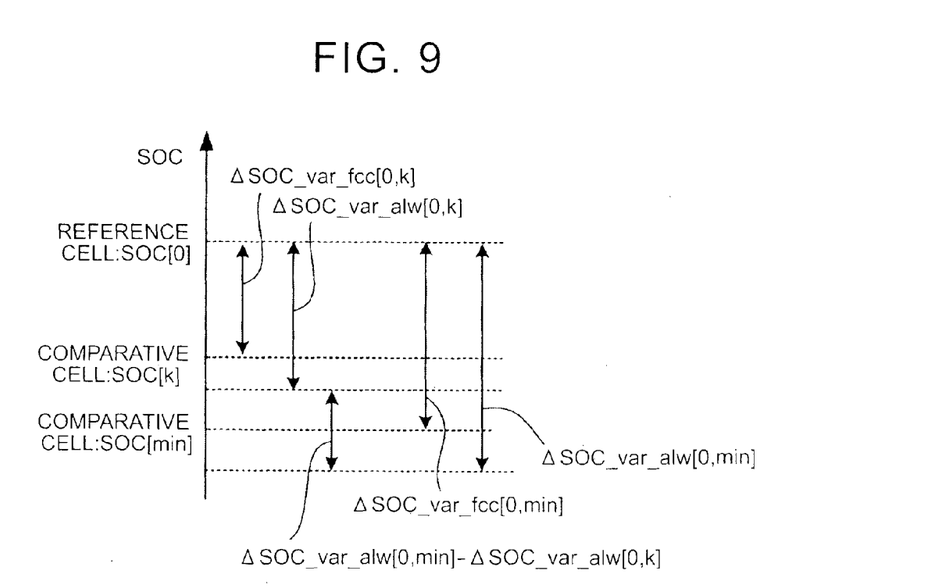
FIG. 9 is a view that illustrates an SOC variation between the reference cell and each comparative cell.

FIG. 9 shows a relationship between the allowable value $\Delta SOC\_var\_alw[0, k]$ and the difference $\Delta SOC\_var\_fcc[0, k]$, between the reference cell 11 and a corresponding one of the two comparative cells 11. In FIG. 9, the SOC[k] in each of the two comparative cells 11 is lower than the SOC[0] of the reference cell 11. In FIG. 9, one of the two comparative cells 11 indicates the comparative cell 11 having the lowest SOC, and the SOC[k] of the comparative cell 11 is denoted by SOC[min].

In the process of step S104, within the difference between the SOC[min] and the SOC of the other comparative cell 11, a difference in consideration of the allowable values ΔSOC_var_alw[0, min], ΔSOC_var_alw[0, k] is calculated. In other words, within the difference between the SOC[min] and the SOC of the other comparative cell 11, a difference corresponding to an SOC variation due to a full charge capacity variation is calculated.

Subsequently, in step S105, the controller 30 compares the current SOC[k] with the SOC_blc_stop[k] calculated in the process of step S104 for each comparative cell 11. When the SOC[k] is higher than the SOC_blc_stop[k], the process proceeds to the process of step S106; whereas, when the SOC[k] is lower than or equal to the SOC_blc_stop[k], the process proceeds to the process of step S107.

The process of step S105 is synonymous with the process of determining whether the difference between the SOC [min] and the SOC[k], at the moment, is larger than the difference in SOC due to a full charge capacity variation. The difference in SOC due to a full charge capacity variation is a difference in SOC, which arises due to a full charge capacity variation between the comparative cell 11 having the SOC[min] and each of the other comparative cells 11. The current difference between the SOC[min] and each SOC[k] corresponds to a second SOC difference according to the invention.

In step S106, the controller 30 carries out the equalizing process over the comparative cell 11 of which the SOC[k] is higher than the SOC_blc_stop[k]. Specifically, the controller 30 discharges the intended comparative cell 11 by activating the corresponding equalizing circuit 50. While the intended comparative cell 11 is being discharged, the controller 30 calculates the current SOC[k] of the intended comparative cell 11 and discharges the intended comparative cell 11 until the current SOC[k] reaches the SOC_blc_stop[k].

Through the process of step S106, the difference between the SOC[min] and each SOC[k] before the equalizing process is carried out approaches the difference in SOC due to a full charge capacity variation. The difference in SOC due to a full charge capacity variation is a difference in SOC, which arises due to a full charge capacity variation between the comparative cell 11 having the SOC[min] and each of the other comparative cells 11. When the equalizing process is complete, there is only the difference in SOC due to a full charge capacity variation in each of the plurality of comparative cells 11.

Figure 10:
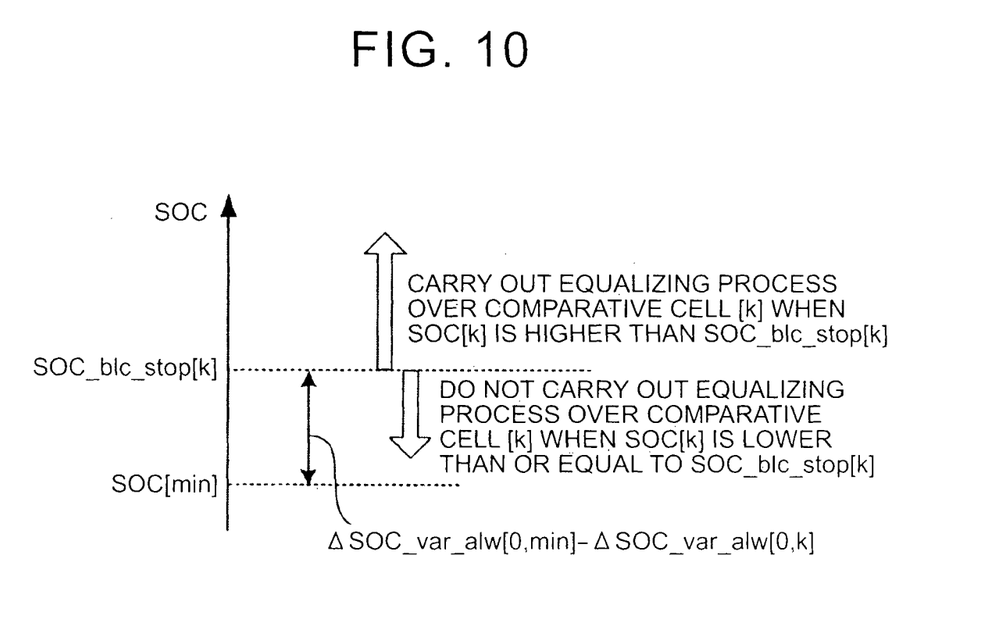
FIG. 10 is a view that illustrates an SOC that is a reference of the equalizing process according to the embodiment.

FIG. 10 shows a relationship between the SOC[min] and the SOC_blc_stop[k]. As is apparent from the above mathematical expression (6), the difference between the SOC[min] and the SOC_blc_stop[k] corresponds to the difference between the allowable value ΔSOC_var_alw[0, min] and the allowable value ΔSOC_var_alw[0, k].

When the SOC[k] is higher than the SOC_blc_stop[k], the controller 30 determines that the SOC[k] varies beyond the allowable amount with respect to the SOC[min]. As described above, the allowable amount is an allowable amount based on the accuracy of estimating the full charge capacity, or the like, and corresponds to the difference between the allowable value ΔSOC_var_alw[0, min] and the allowable value ΔSOC_var_alw[0, k].

When the SOC[k] varies beyond the allowable amount with respect to the SOC[min], the controller 30 carries out the equalizing process in order to suppress an SOC variation. That is, as shown in FIG. 10, when the SOC[k] is higher than the SOC_blc_stop[k], the controller 30 carries out the equalizing process over the comparative cell 11.

On the other hand, in step S107, the controller 30 does not carry out the equalizing process over the comparative cell 11 of which the SOC[k] is lower than or equal to the SOC_blc_stop[k]. When the SOC[k] is lower than or equal to the SOC_blc_stop[k], the controller 30 determines that the SOC[k] falls within the range of the allowable amount with respect to the SOC[min]. The allowable amount is also an allowable amount based on the accuracy of estimating the full charge capacity, or the like, and corresponds to a difference between the allowable value ΔSOC_var_alw[0, min] and the allowable value ΔSOC_var_alw[0, k].

When the SOC[k] falls within the range of the allowable amount with respect to the SOC[min], it is not possible to determine whether to carry out the equalizing process over the comparative cell 11 having the SOC[k]. Therefore, as shown in FIG. 10, the controller 30 does not carry out the equalizing process over the comparative cell 11 of which the SOC[k] is lower than or equal to the SOC_blc_stop[k].

According to the present embodiment, the allowable value ΔSOC_var_alw[0, k] is calculated; however, the allowable value ΔSOC_var_alw[0, k] does not need to be calculated. That is, it is applicable that the difference ΔSOC_var_fcc[0, k] is calculated and the equalizing process is carried out on the basis of the difference ΔSOC_var_fcc[0, k]. Specifically, in the process shown in FIG. 7, the process of step S102 may be omitted, and, in the processes of step S103 and step S104, the difference ΔSOC_var_fcc[0, k] is used instead of the allowable value ΔSOC_var_alw[0, k].

According to the present embodiment, an SOC variation (ΔSOC_var_fcc[0, k]) due to a full charge capacity variation is calculated in consideration of the full charge capacity of each single cell 11. Then, only when the difference between the SOC[0] and the SOC[k], at the moment, is larger than the ΔSOC_var_fcc[0, k], the equalizing process is carried out. In other words, when the difference between the SOC[0] and the SOC[k], at the moment, is smaller than or equal to the ΔSOC_var_fcc[0,k], the equalizing process is not carried out.

In this way, in the present embodiment, SOC variations due to full charge capacity variations are acquired, and the equalizing process is not carried out for SOC variations due to full charge capacity variations. Thus, it is possible to suppress a situation that the equalizing process is frequently carried out on the basis of SOC variations due to full charge capacity variations and, as a result, electric energy stored in the single cells 11 tends to be wastefully consumed. The equalizing process is carried out for SOC variations due to a factor other than full charge capacity variations, so it is possible to achieve the object of the equalizing process.

In the present embodiment, SOC variations (ΔSOC_var_alw[0, k]) are calculated in consideration of the accuracy of estimating the full charge capacities and the current relationship between each SOC[k] and the SOC_base. In a state where the accuracy of estimating the full charge capacities is low, even when the ΔSOC_var_fcc[0, k] is calculated, SOC variations are hard to be accurately acquired. In addition, in a state where there is a full charge capacity variation, the SOC tends to vary as the SOC[k] becomes apart from the SOC_base, so it is difficult to accurately acquire an SOC variation only by calculating the ΔSOC_var_fcc[0, k].

Therefore, in the present embodiment, as described in the process of step S102 in FIG. 7, SOC variations (ΔSOC_var_alw[0, k]) are calculated in consideration of the accuracy of estimating the full charge capacities, or the like. Thus, it is possible to acquire actual SOC variations due to full charge capacity variations on the basis of the ΔSOC_var_alw[0, k].

While the invention has been described with reference to example embodiments thereof, it is to be understood that the invention is not limited to the described embodiments or constructions. To the contrary, the invention is intended to cover various modifications and equivalent arrangements. In addition, while the various elements of the example embodiments are shown in various combinations and configurations, other combinations and configurations, including more, less or only a single element, are also within the scope of the invention.

The invention claimed is:

1. An electrical storage system comprising:
a plurality of electrical storage elements connected in series with each other and configured to be charged or discharged;
a plurality of discharge circuits respectively connected in parallel with the electrical storage elements and configured to discharge the corresponding electrical storage elements; and
a controller configured to control operations of the discharge circuits,
the controller being configured to calculate a first SOC difference using a full charge capacity of each electrical storage element, the first SOC difference being a difference in SOC between the plurality of electrical storage elements and arising due to a difference in full charge capacity between the plurality of electrical storage elements,
the controller being further configured to calculate a second SOC difference, the second SOC difference being a difference in SOC between the plurality of electrical storage elements at the moment the second SOC difference is calculated,
the controller being further configured to bring the second SOC difference close to the first SOC difference by carrying out a discharge with the use of the discharge circuits when the second SOC difference is larger than the first SOC difference, and
the controller being further configured to calculate the first SOC difference using a mathematical expression $$\Delta SOC\_var\_fcc[0, k] = \frac{(FCC[k] - FCC[0]) \times (SOC\_base - SOC[0])}{FCC[k]}$$

where ΔSOC_var_fcc[0,k] is the first SOC difference, FCC[0] is the full charge capacity of the electrical storage element that becomes a reference electrical storage element between the plurality of electrical storage elements, FCC[k] is the full charge capacity of the electrical storage element other than the reference electrical storage element between the plurality of electrical storage elements, SOC_base is an SOC at the time when the SOCs of the plurality of electrical storage elements are equal to each other, and SOC[0] is the SOC of the reference electrical storage element, wherein
the SOC_base is an SOC that each electrical storage element takes when the plurality of electrical storage elements are not connected to a load, and
the SOC_base varies on the basis of a usage frequency of a charging function for completing a charge of the plurality of electrical storage elements at predetermined time.

2. The electrical storage system according to claim 1, wherein
the controller is configured to correct the first SOC difference using a mathematical expression ΔSOC_var_alw[0,k]=ΔSOC_var_fcc[0,k]×
(1+|SOC_base−SOC[k]|×K)

where ΔSOC_var_alw[0, k] is the corrected first SOC difference, ΔSOC_var_fcc[0, k] is the not-yet-corrected first SOC difference, SOC_base is an SOC at the time when the SOCs of the plurality of electrical storage elements are equal to each other, SOC[k] is the SOC of the electrical storage element other than the reference electrical storage element, and K is a correction coefficient.

3. The electrical storage system according to claim 1, wherein
the SOC_base decreases as the usage frequency of the charging function increases, and the SOC_base increases as the usage frequency of the charging function decreases.

4. The electrical storage system according to claim 1, wherein the controller is configured to use a value, including a calculation error at the time of calculating the full charge capacity of each electrical storage element, as the first SOC difference.

5. The electrical storage system according to claim 1, wherein the controller is configured to operate the discharge circuits when the plurality of electrical storage elements are not connected to a load.

6. An equalizing method of equalizing a difference in SOC between a plurality of electrical storage elements, connected in series with each other, with the use of discharge circuits respectively connected in parallel with the electrical storage elements and configured to discharge the corresponding electrical storage elements, the equalizing method comprising:
calculating a first SOC difference using a full charge capacity of each electrical storage element, the first SOC difference being a difference in SOC between the plurality of electrical storage elements and arising due to a difference in full charge capacity between the plurality of electrical storage elements;
calculating a second SOC difference, the second SOC difference being a difference in SOC between the plurality of electrical storage elements at the moment the second SOC difference is calculated,
when the second SOC difference is larger than the first SOC difference, bringing the second SOC difference close to the first SOC difference by carrying out a discharge with the use of the discharge circuits,
calculating the first SOC difference using a mathematical expression $$\Delta SOC\_var\_fcc[0, k] = \frac{(FCC[k] - FCC[0]) \times (SOC\_base - SOC[0])}{FCC[k]}$$

where ΔSOC_var_fcc[0,k] is the first SOC difference, FCC[0] is the full charge capacity of the electrical storage element that becomes a reference electrical storage element between the plurality of electrical storage elements, FCC[k] is the full charge capacity of the electrical storage element other than the reference electrical storage element between the plurality of electrical storage elements, SOC_base is an SOC at the time when the SOCs of the plurality of electrical storage elements are equal to each other, and SOC[0] is the SOC of the reference electrical storage element, wherein
- the SOC_base is an SOC that each electrical storage element takes when the plurality of electrical storage elements are not connected to a load, and
- the SOC_base varies on the basis of a usage frequency of a charging function for completing a charge of the plurality of electrical storage elements at predetermined time.

* * * * *